United States Patent
Rui et al.

(10) Patent No.: US 8,486,780 B2
(45) Date of Patent: Jul. 16, 2013

(54) DOPED ELECTRODE FOR DRAM APPLICATIONS

(75) Inventors: Xiangxin Rui, Campbell, CA (US); Hiroyuki Ode, Hiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/219,922

(22) Filed: Aug. 29, 2011

(65) Prior Publication Data
US 2013/0052791 A1 Feb. 28, 2013

(51) Int. Cl.
*H01L 21/8242* (2006.01)
*H01L 21/329* (2006.01)

(52) U.S. Cl.
USPC .... 438/240; 438/250; 438/256; 257/E21.648; 257/E21.008; 257/E21.351

(58) Field of Classification Search
USPC ............. 438/239, 250–253, 256, 393–396, 438/399; 257/E21.008, E21.35, E21.351, 257/E21.396, E21.647, E21.648, E21.664
See application file for complete search history.

(56) References Cited

U.S. PATENT DOCUMENTS

| | | | |
|---|---|---|---|
| 6,774,463 B1 * | 8/2004 | Chaudhari et al. | 257/663 |
| 2005/0006644 A1 * | 1/2005 | Klein | 257/43 |
| 2006/0234442 A1 * | 10/2006 | Yamazaki et al. | 438/250 |
| 2007/0103614 A1 * | 5/2007 | Yoon et al. | 349/43 |
| 2007/0120124 A1 * | 5/2007 | Chen et al. | 257/43 |
| 2007/0141778 A1 * | 6/2007 | Lin et al. | 438/253 |
| 2007/0284636 A1 * | 12/2007 | Noma et al. | 257/295 |
| 2008/0286912 A1 * | 11/2008 | Park et al. | 438/155 |

* cited by examiner

*Primary Examiner* — Charles Garber
*Assistant Examiner* — Calvin Choi

(57) ABSTRACT

A metal oxide first electrode layer for a MIM DRAM capacitor is formed wherein the first and/or second electrode layers contain one or more dopants up to a total doping concentration that will not prevent the electrode layers from crystallizing during a subsequent anneal step. One or more of the dopants has a work function greater than about 5.0 eV. One or more of the dopants has a resistivity less than about 1000 μΩ cm. Advantageously, the electrode layers are conductive molybdenum oxide.

17 Claims, 8 Drawing Sheets

DOPED ELECTRODE FOR DRAM APPLICATIONS

This document relates to the subject matter of a joint research agreement between Intermolecular, Inc. and Elpida Memory, Inc

FIELD OF THE INVENTION

The present invention relates generally to the use of non-noble metal electrodes in capacitors used in Dynamic Random Access Memory (DRAM) devices.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally <$10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 20. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

One class of high-k dielectric materials possessing the characteristics required for implementation in advanced DRAM capacitors are high-k metal oxide materials. Titanium dioxide ($TiO_2$) is a metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of $TiO_2$, the anatase crystalline phase of $TiO_2$ has a dielectric constant of approximately 40, while the rutile crystalline phase of $TiO_2$ can have a dielectric constant of approximately >80. Due to the higher-k value of the rutile-phase, it is desirable to produce $TiO_2$ based DRAM capacitors with the $TiO_2$ in the rutile-phase. The relative amounts of the anatase phase and the rutile phase can be determined from x-ray diffraction (XRD). From Eqn. 1 above, a $TiO_2$ layer in the rutile-phase could be physically thicker and maintain the desired capacitance. The increased physical thickness is important for lowering the leakage current of the capacitor. The anatase phase will transition to the rutile phase at high temperatures (>800 C.). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Conductive metal oxides, conductive metal silicides, conductive metal nitrides, conductive metal carbides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the MoO$_2$ electrode because they do not promote the deposition of the rutile-phase of TiO$_2$. For example, MoO$_3$ (the most oxygen-rich phase) has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline MoO$_2$ and to minimize the presence of MoO$_{2+x}$ phases. Deposition processes and post-treatment processes in a reducing atmosphere have been developed that allow crystalline MoO$_2$ to be used as the first electrode (i.e. bottom electrode) in MIM DRAM capacitors with TiO$_2$ or doped-TiO$_2$ high-k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. Other conductive metal oxides that may be used as a template for the rutile phase of TiO$_2$ include the conductive compounds of molybdenum oxide, tungsten oxide, ruthenium oxide, iron oxide, iridium oxide, chromium oxide, manganese oxide, tin oxide, cobalt oxide, or nickel oxide.

The use of MoO$_2$ as a first electrode has a number of additional issues. Although the work function can be around 5.0 eV, this is not high enough to minimize the leakage current to meet the specifications of some advanced devices. Additionally, the resistivity of MoO$_2$ is high (~1000 µΩ cm). This impacts the speed and power usage of the device.

Therefore, there is a need to develop processes that allow the formation of a metal oxide first electrode that can serve as a template for the rutile phase of TiO$_2$, has a high work function that contributes to lower leakage current, and has low resistivity which contributes to higher device speed and lower power usage.

SUMMARY OF THE DISCLOSURE

In some embodiments of the present invention, a metal oxide first electrode layer is formed as part of a MIM DRAM capacitor stack. Optionally, a buffer layer may be formed between the first electrode layer and the substrate to improve adhesion and to promote the growth of specific crystalline phases. The first electrode layer is doped with one or more dopants. The dopants increase the work function of the first electrode layer and/or lower the resistivity of the first electrode layer. The dopants may be uniformly distributed throughout the first electrode layer or may be distributed with a gradient in their concentration profile.

In some embodiments of the present invention, a metal oxide second electrode layer is formed as part of a MIM DRAM capacitor stack. The second electrode layer is doped with one or more dopants. The dopants increase the work function of the second electrode layer and/or lower the resistivity of the second electrode layer. The dopants may be uniformly distributed throughout the second electrode layer or may be distributed with a gradient in their concentration profile.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
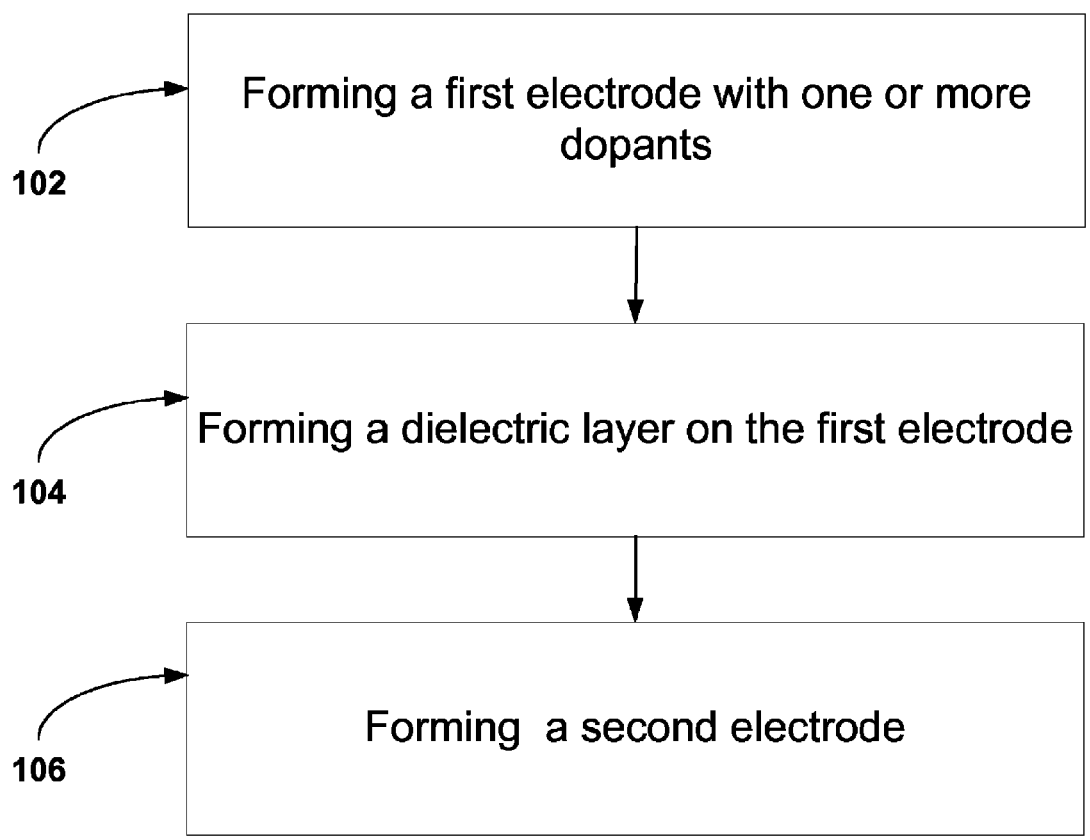
FIG. 1 illustrates a flow chart illustrating a method for fabricating a DRAM capacitor stack in accordance with some embodiments of the present invention.

FIG. 1 describes a method, 100, for fabricating a DRAM capacitor stack. The initial step, 102, comprises forming a first electrode layer on a substrate, wherein the first electrode layer comprises a metal element. Examples of suitable electrode materials comprise metals, conductive metal oxides, conductive metal silicides, conductive metal nitrides, and combinations thereof. A particularly interesting class of materials is the conductive metal oxides. The first electrode is formed with one or more dopants added that alter the work function and/or the resistivity of the first electrode. The dopants may be uniformly distributed throughout the second electrode layer or may be distributed with a gradient in their concentration profile. The first electrode layer can then be subjected to an annealing process (not shown). The next step, 104, comprises forming a dielectric material on the first electrode layer. Optionally, the dielectric layer can then be subjected to a post dielectric anneal (PDA) treatment (not shown). The PDA step serves to crystallize the dielectric layer and fill oxygen vacancies. The next step, 106, comprises forming a second electrode on the dielectric layer, wherein the second electrode layer comprises a metal element. Examples of suitable electrode materials comprise metals, conductive metal oxides, conductive metal silicides, conductive metal nitrides, and combinations thereof. Optionally, the capacitor stack can then be subjected to PMA treatment process (not shown). Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

Figure 2:
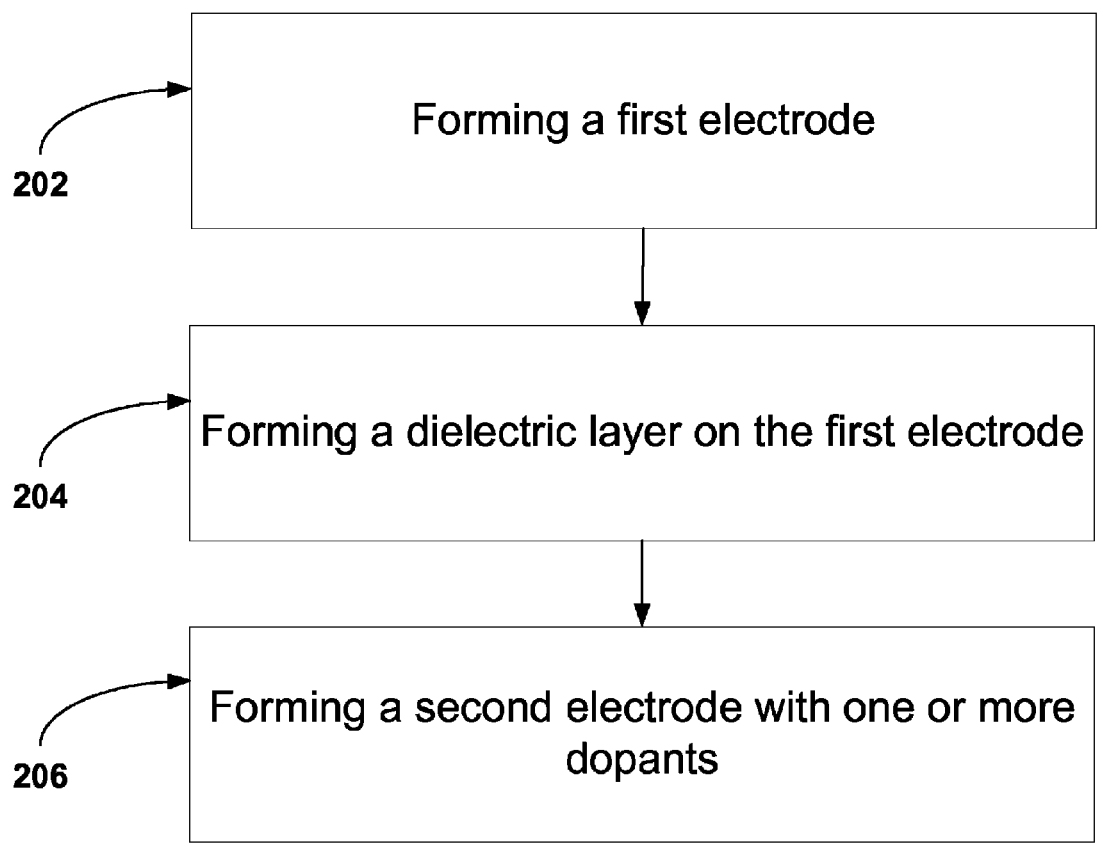
FIG. 2 illustrates a flow chart illustrating a method for fabricating a DRAM capacitor stack in accordance with some embodiments of the present invention.

FIG. 2 describes a method, 200, for fabricating a DRAM capacitor stack. The initial step, 202, comprises forming a first electrode layer on a substrate, wherein the first electrode layer comprises a metal element. The next step, 204, comprises forming a dielectric material on the first electrode layer. Optionally, the dielectric layer can then be subjected to a post dielectric anneal (PDA) treatment (not shown). The PDA step serves to crystallize the dielectric layer and fill oxygen vacancies. The next step, 206, comprises forming a second electrode on the dielectric layer, wherein the second electrode layer comprises a metal element. Examples of suitable second electrode materials comprise metals, conductive metal oxides, conductive metal silicides, conductive metal nitrides, and combinations thereof. A particularly interesting class of materials is the conductive metal oxides. The second electrode is formed with one or more dopants added that alter the work function and/or the resistivity of the second electrode. The dopants may be uniformly distributed throughout the second electrode layer or may be distributed with a gradient in their concentration profile. Optionally, the capacitor stack can then be subjected to PMA treatment process (not shown).

Figure 3:
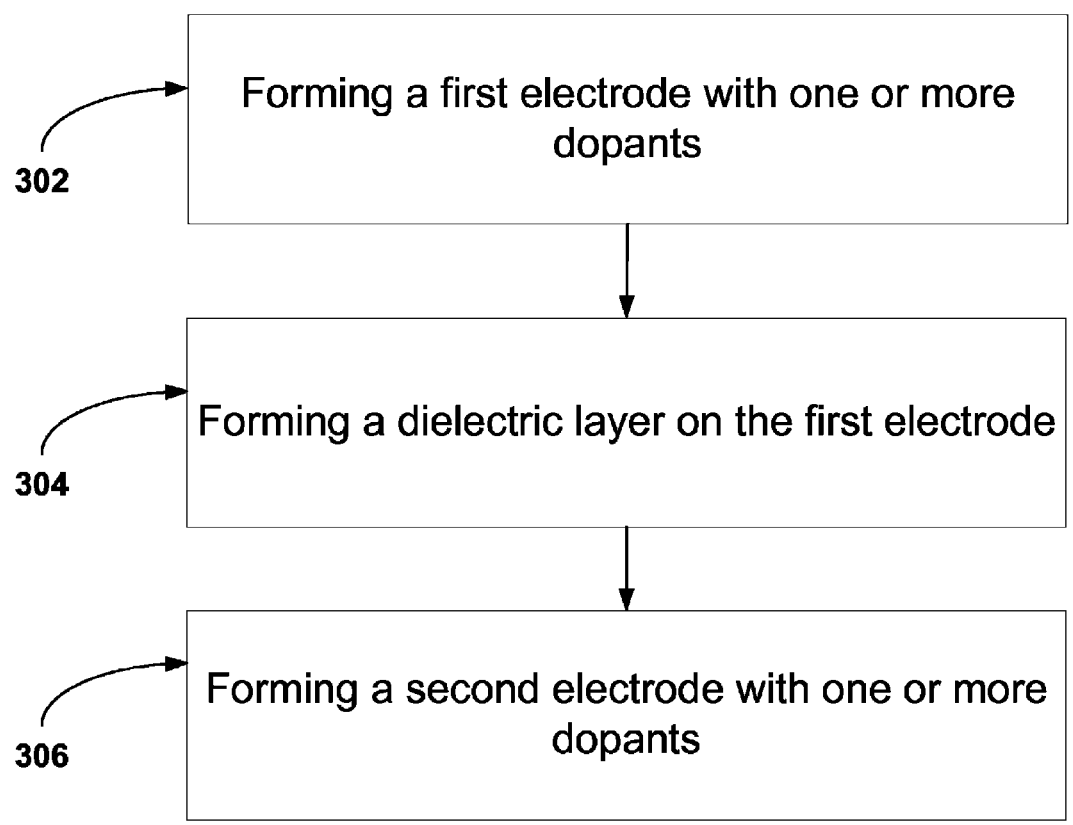
FIG. 3 illustrates a flow chart illustrating a method for fabricating a DRAM capacitor stack in accordance with some embodiments of the present invention.

FIG. 3 describes a method, 300, for fabricating a DRAM capacitor stack. The initial step, 302, comprises forming a first electrode layer on a substrate, wherein the first electrode layer comprises a metal element. Examples of suitable electrode materials comprise metals, conductive metal oxides, conductive metal silicides, conductive metal nitrides, and combinations thereof. A particularly interesting class of materials is the conductive metal oxides. The first electrode is formed with one or more first dopants added that alter the work function and/or the resistivity of the first electrode. The dopants may be uniformly distributed throughout the second electrode layer or may be distributed with a gradient in their concentration profile. The first electrode layer can then be subjected to an annealing process (not shown). The next step, 304, comprises forming a dielectric material on the first electrode layer. Optionally, the dielectric layer can then be subjected to a post dielectric anneal (PDA) treatment (not shown). The PDA step serves to crystallize the dielectric layer and fill oxygen vacancies. The next step, 306, comprises forming a second electrode on the dielectric layer, wherein the second electrode layer comprises a metal element. Examples of suitable second electrode materials comprise metals, conductive metal oxides, conductive metal silicides, conductive metal nitrides, and combinations thereof. A particularly interesting class of materials is the conductive metal oxides. The second electrode is formed with one or more second dopants added that alter the work function and/or the resistivity of the second electrode. The dopants may be uniformly distributed throughout the second electrode layer or may be distributed with a gradient in their concentration profile. The first and second dopants may be the same or may be different materials. Optionally, the capacitor stack can then be subjected to PMA treatment process (not shown).

Those skilled in the art will appreciate that each of the first electrode layer, the dielectric layer, and the second electrode structure used in the MIM DRAM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

In FIGS. 4-8 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 4:
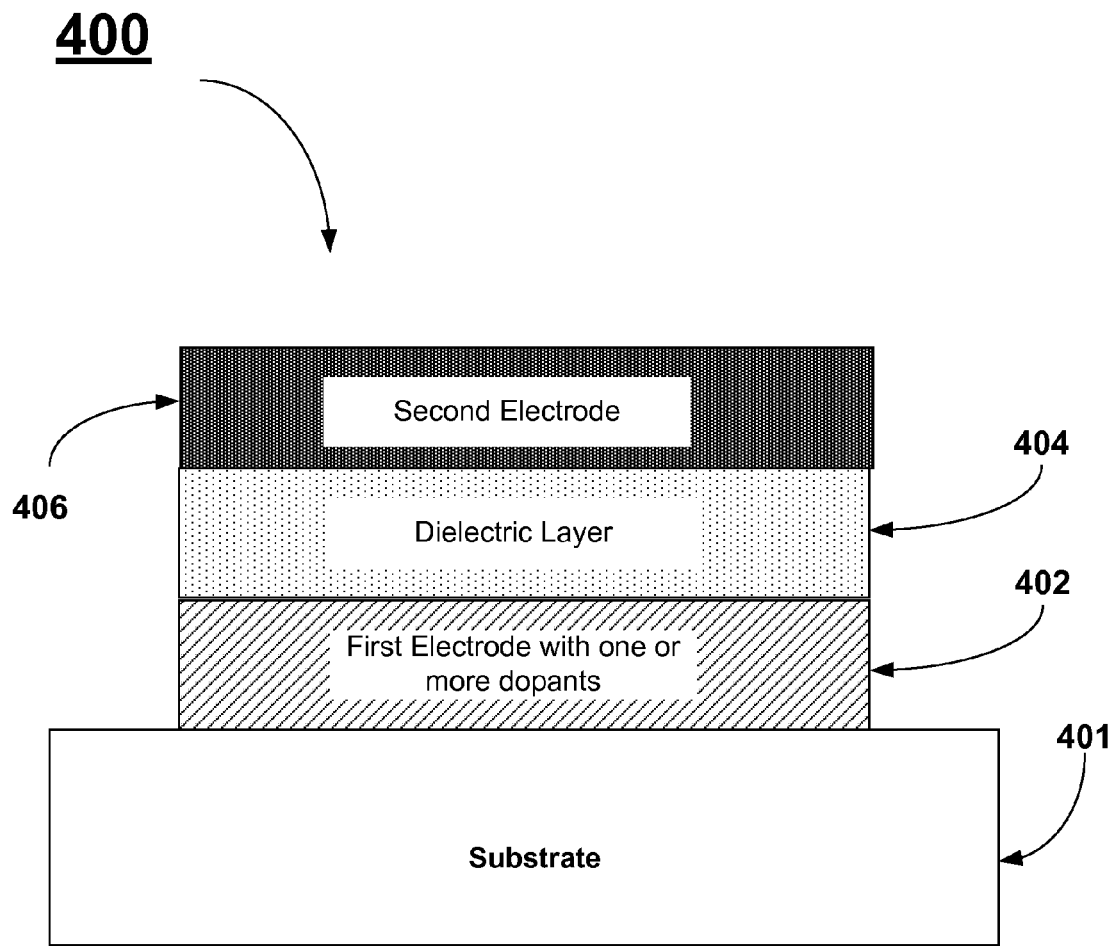
FIG. 4 illustrates a simplified cross-sectional view of a DRAM capacitor stack fabricated in accordance with some embodiments of the present invention.

FIG. 4 illustrates a simple capacitor stack, 400, consistent with some embodiments of the present invention. Using the method as outlined in FIG. 1 and described above, first electrode layer, 402, is formed on substrate, 401. Generally, the substrate has already received several processing steps in the manufacture of a full DRAM device. First electrode layer, 402, comprises one of metals, conductive metal oxides, conductive metal nitrides, conductive metal silicides, etc. In some embodiments of the present invention, the first electrode layer is a conductive metal oxide. The first electrode is formed with one or more dopants added that alter the work function and/or the resistivity of the second electrode. The dopants may be uniformly distributed throughout the second electrode layer or may be distributed with a gradient in their concentration profile.

Dopants may be added to the first electrode layer to alter properties such as the work function and the resistivity. The dopants may be added to the first electrode layer by introducing the dopant species during the formation of the first electrode layer. Typically, the first electrode layers are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, or combinations thereof (i.e. metal-silicon-nitride, or metal-silicon-oxygen-nitride, etc). The goal is to choose dopants that have work function values greater than about 5.0 eV. Examples of a few metal and metal oxide dopants and their corresponding work function values include Ni (5.35 eV), Ir (5.67 eV), Pt (5.64 eV), $RuO_2$ (rutile −5.1 eV), $IrO_2$ (rutile −5.6 eV), NiO (5.2 eV). These dopants may be added individually or may be added in combination. The dopants may be uniformly distributed throughout the first electrode layer or may be distributed with a gradient in their concentration profile. A second class of dopants may be added to the first electrode to lower the resistivity. The dopants may be metals, metal oxides, metal nitrides, metal silicides, metal carbides, or combinations thereof (i.e. metal-silicon-nitride, or metal-silicon-oxygen-nitride, etc). Two examples of metal oxide materials with low resistivity are $IrO_2$ (~50 μΩ cm) and $RuO_2$ (~35 μΩ cm). The goal is to choose dopants that have resistivity values less than about 1000 μΩ cm. These dopants may be added individually or may be added in combination. The dopants may be uniformly distributed throughout the first electrode layer or may be distributed with a gradient in their concentration profile. $RuO_2$ and $IrO_2$ are examples of dopants that may improve the work function and lower the resistivity (i.e. they serve both rolls). The dopants will be added to a concentration that will not negatively impact the ability of the first electrode layer to form the desired crystalline phase to serve as a template for the rutile phase of $TiO_2$ formed in a subsequent step. The maximum doping concentration will vary depending on the dopant material and subsequent anneal conditions. Generally, the doping concentration is chosen such that it does not prevent the first electrode from crystallizing during the subsequent anneal step. As used herein, the first electrode will be considered to be crystallized if it is ≧30% crystalline after the anneal as determined by techniques such as x-ray diffraction (XRD). The first electrode, 402, can be annealed to crystallize the material.

In the next step, dielectric layer, 404, would then be formed on the first electrode layer, 402. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $BaSrTiO_x$ (BST), $PbZrTiO_x$ (PZT), or doped versions of the same. These dielectric materials may be formed as a single layer or may be formed as a hybrid or nanolaminate structure. In some embodiments of the present invention, the dielectric layer is $TiO_2$. Typically, dielectric layer, 404, is subjected to a PDA treatment before the formation of the second electrode as mentioned earlier.

In the next step, the second electrode layer, 406, is formed on dielectric layer, 404. The second electrode layer comprises one of metals, conductive metal oxides, conductive metal nitrides, conductive metal silicides, conductive metal carbides, etc. Typically, the capacitor stack would then be subjected to a PMA treatment.

Figure 5:
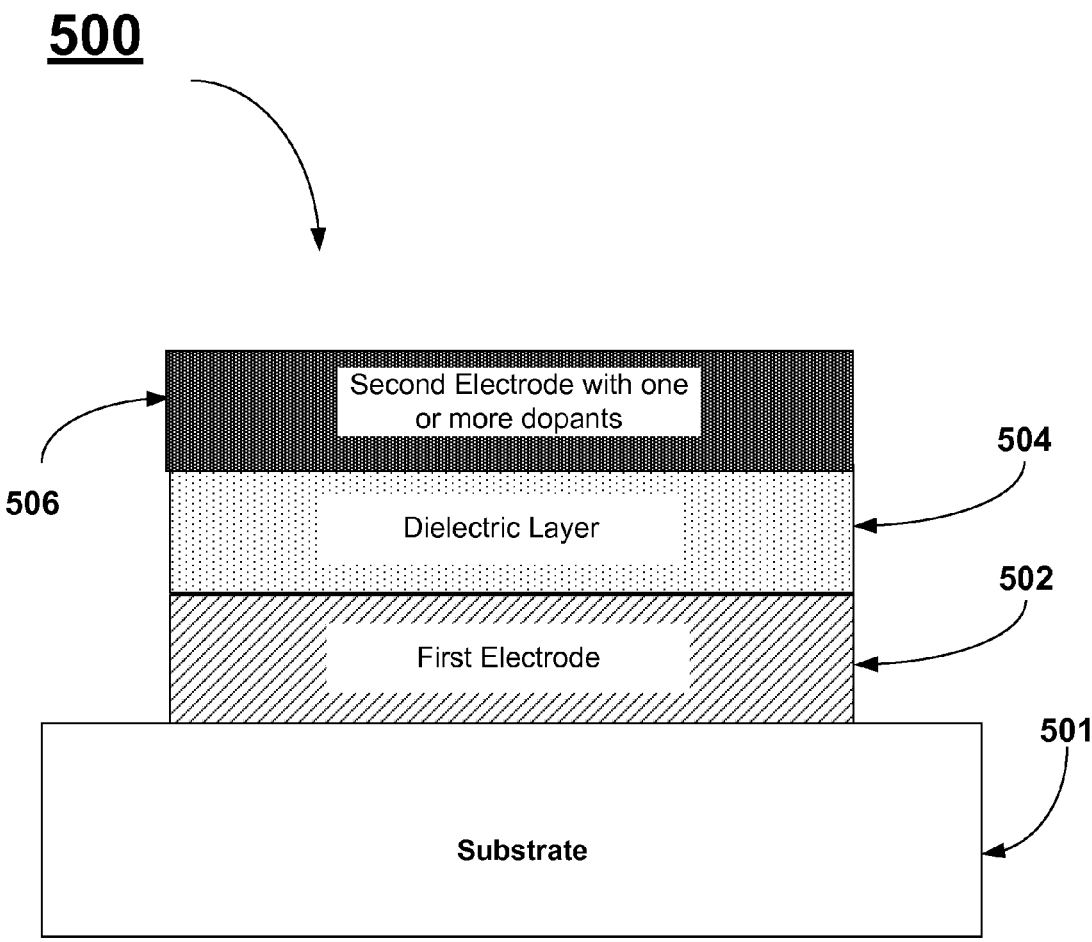
FIG. 5 illustrates a simplified cross-sectional view of a DRAM capacitor stack fabricated in accordance with some embodiments of the present invention.

FIG. 5 illustrates a simple capacitor stack, 500, consistent with some embodiments of the present invention. Using the method as outlined in FIG. 2 and described above, first electrode layer, 502, is formed on substrate, 501. Generally, the substrate has already received several processing steps in the manufacture of a full DRAM device. First electrode layer, 502, comprises one of metals, conductive metal oxides, conductive metal nitrides, conductive metal silicides, etc. In some embodiments of the present invention, the first electrode layer is a conductive metal oxide. The first electrode, 502, can be annealed to crystallize the material.

In the next step, dielectric layer, 504, would then be formed on the first electrode layer, 502. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $BaSrTiO_x$ (BST), $PbZrTiO_x$ (PZT), or doped versions of the same. These dielectric materials may be formed as a single layer or may be formed as a hybrid or nanolaminate structure. In some embodiments of the present invention, the dielectric layer is $TiO_2$. Typically, dielectric layer, 504, is subjected to a PDA treatment before the formation of the second electrode as mentioned earlier.

In the next step, the second electrode layer, 506, is formed on dielectric layer, 504. The second electrode layer comprises one of metals, conductive metal oxides, conductive metal nitrides, conductive metal silicides, conductive metal carbides, etc. The second electrode is formed with one or more dopants added that alter the work function and/or the resistivity of the second electrode. The dopants may be uniformly distributed throughout the second electrode layer or may be distributed with a gradient in their concentration profile.

Dopants may be added to the second electrode layer to alter properties such as the work function and the resistivity. The dopants may be added to the second electrode layer by introducing the dopant species during the formation of the second electrode layer. Typically, the second electrode layers are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, or combinations thereof (i.e. metal-silicon-nitride, or metal-silicon-oxygen-nitride, etc). The goal is to choose dopants that have work function values greater than about 5.0 eV. Examples of a few metal and metal oxide dopants and their corresponding work function values include Ni (5.35 eV), Ir (5.67 eV), Pt (5.64 eV), $RuO_2$ (rutile ~5.1 eV), $IrO_2$ (rutile ~5.6 eV), NiO (5.2 eV). These dopants may be added individually or may be added in combination. The dopants may be uniformly distributed throughout the second electrode layer or may be distributed with a gradient in their concentration profile. A second class of dopants may be added to the second electrode to lower the resistivity. The dopants may be metals, metal oxides, metal nitrides, metal silicides, metal carbides, or combinations thereof (i.e. metal-silicon-nitride, or metal-silicon-oxygen-nitride, etc). Two examples of metal oxide materials with low resistivity are $IrO_2$ (~50 µΩ cm) and $RuO_2$ (~35 µΩ cm). The goal is to choose dopants that have resistivity values less than about 1000 µΩ cm. These dopants may be added individually or may be added in combination. The dopants may be uniformly distributed throughout the second electrode layer or may be distributed with a gradient in their concentration profile. $RuO_2$ and $IrO_2$ are examples of dopants that may improve the work function and lower the resistivity (i.e. they serve both rolls). The maximum doping concentration will vary depending on the dopant material and subsequent anneal conditions. Generally, the doping concentration is chosen such that it does not prevent the second electrode from crystallizing during the subsequent anneal step. As used herein, the second electrode will be considered to be crystallized if it is ≧30% crystalline after the anneal as determined by techniques such as x-ray diffraction (XRD). Typically, the capacitor stack would then be subjected to a PMA treatment.

Figure 6:
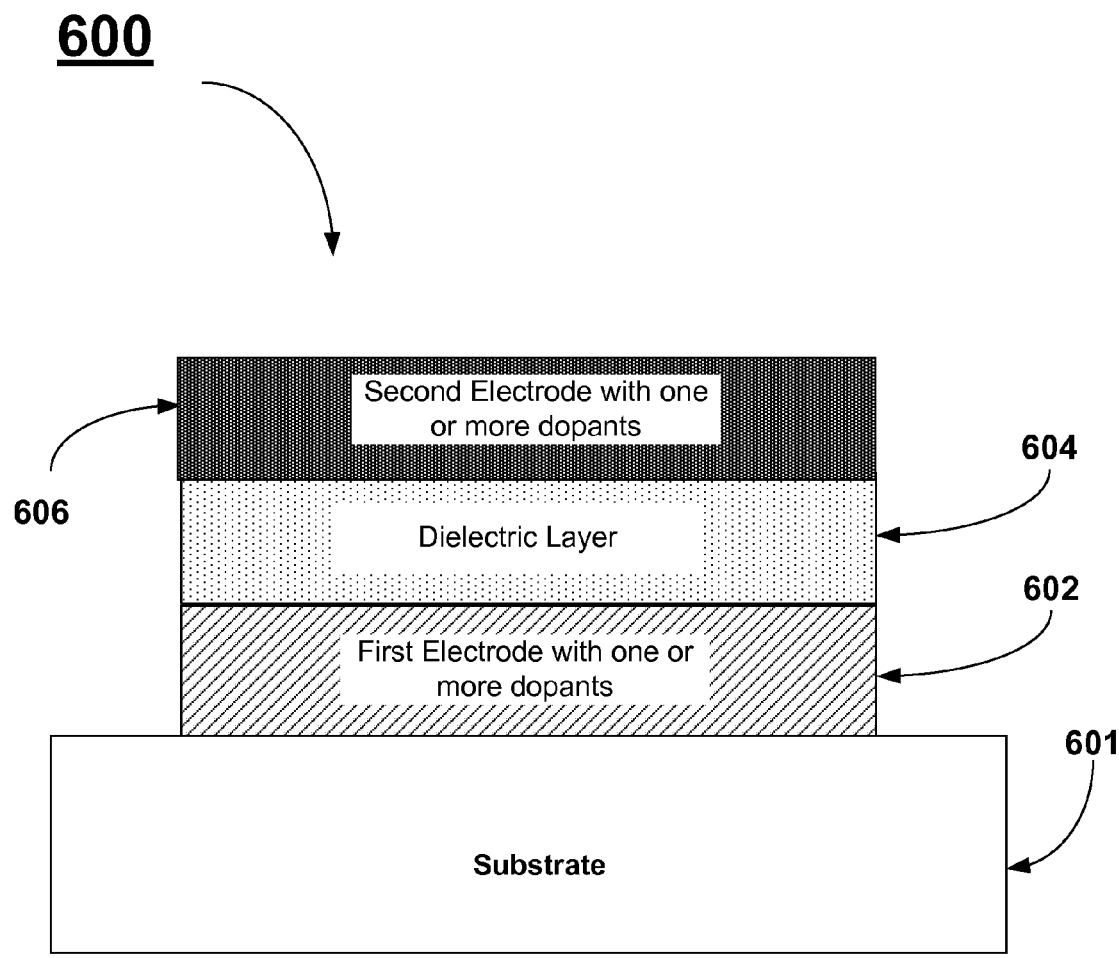
FIG. 6 illustrates a simplified cross-sectional view of a DRAM capacitor stack fabricated in accordance with some embodiments of the present invention.

FIG. 6 illustrates a simple capacitor stack, 600, consistent with some embodiments of the present invention. Using the method as outlined in FIG. 3 and described above, first electrode layer, 602, is formed on substrate, 601. Generally, the substrate has already received several processing steps in the manufacture of a full DRAM device. First electrode layer, 602, comprises one of metals, conductive metal oxides, conductive metal nitrides, conductive metal silicides, etc. In some embodiments of the present invention, the first electrode layer is a conductive metal oxide. The first electrode is formed with one or more first dopants added that alter the work function and/or the resistivity of the second electrode as described previously. The dopants may be uniformly distributed throughout the first electrode layer or may be distributed with a gradient in their concentration profile. The first electrode, 602, can be annealed to crystallize the material.

In the next step, dielectric layer, 604, would then be formed on the first electrode layer, 602. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $BaSrTiO_x$ (BST), $PbZrTiO_x$ (PZT), or doped versions of the same. These dielectric materials may be formed as a single layer or may be formed as a hybrid or nanolaminate structure. In some embodiments of the present invention, the dielectric layer is $TiO_2$. Typically, dielectric layer, 604, is subjected to a PDA treatment before the formation of the second electrode as mentioned earlier.

In the next step, the second electrode layer, 606, is formed on dielectric layer, 604. The second electrode layer comprises one of metals, conductive metal oxides, conductive metal nitrides, conductive metal silicides, conductive metal carbides, etc. The second electrode is formed with one or more second dopants added that alter the work function and/or the resistivity of the second electrode as described previously. The dopants may be uniformly distributed throughout the second electrode layer or may be distributed with a gradient in their concentration profile. The first and second dopants may be the same or may be different materials. Typically, the capacitor stack would then be subjected to a PMA treatment.

Figure 7:
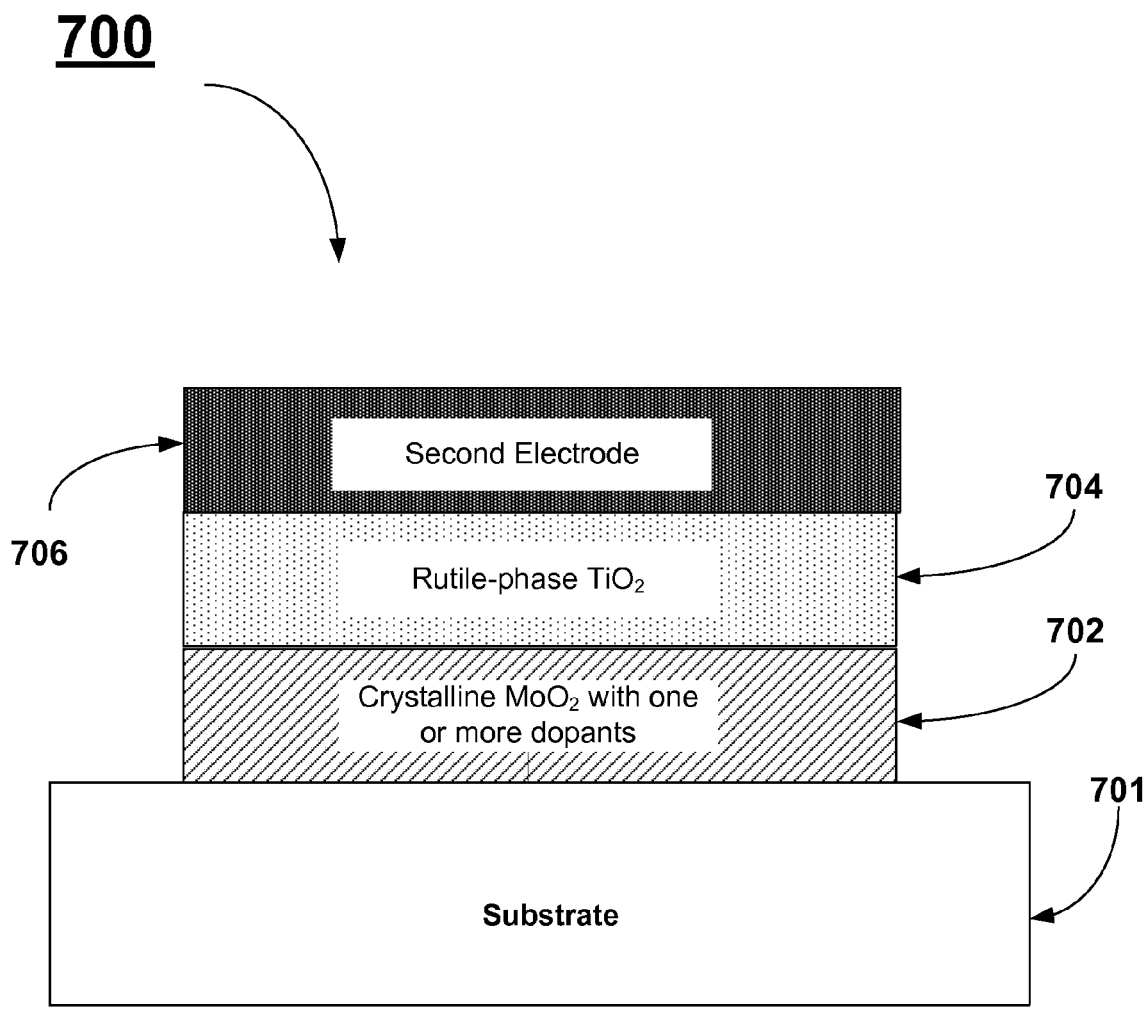
FIG. 7 illustrates a simplified cross-sectional view of a DRAM capacitor stack fabricated in accordance with some embodiments of the present invention.

FIG. 7 illustrates a simple capacitor stack, 700, consistent with some embodiments of the present invention. Using the method as outlined in FIG. 1 and described above, first electrode layer, 702, is formed on substrate, 701. Generally, the substrate has already received several processing steps in the manufacture of a full DRAM device. First electrode layer, 702, comprises one of metals, conductive metal oxides, conductive metal nitrides, conductive metal silicides, conductive metal carbides, etc. For this example, first electrode layer, 702, comprises a conductive metal oxide that may serve to promote the rutile phase of $TiO_2$. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. Specific electrode materials of interest are the conductive metal compounds of molybdenum oxide, tungsten oxide, tin oxide, and cobalt oxide.

Optionally, a buffer layer may be formed between the first electrode layer and the substrate. The buffer layer may improve the adhesion of the first electrode layer to the substrate. Additionally, the buffer layer may promote the formation of specific crystalline phases in the first electrode. As an example, it would be advantageous to promote the growth of the crystalline $MoO_2$ phase of molybdenum oxide so that it can serve as a template for the growth of the rutile phase of $TiO_2$ in a subsequent step. Generally, conductive metal nitride materials are suitable as buffer layers. An example of a buffer layer material includes $Mo_xN$.

In addition to $MoO_2$, other suitable conductive metal oxides that may serve as a template for the growth of the rutile phase of $TiO_2$ in a subsequent step comprise the conductive compounds of molybdenum oxide, tungsten oxide, ruthenium oxide, iron oxide, iridium oxide, chromium oxide, manganese oxide, tin oxide, cobalt oxide, or nickel oxide.

Dopants may be added to the first electrode layer to alter properties such as the work function and the resistivity. The dopants may be added to the first electrode layer by introducing the dopant species during the formation of the first electrode layer. Typically, the first electrode layers are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, or combinations thereof (i.e. metal-silicon-nitride, or metal-silicon-oxygen-nitride, etc). The goal is to choose dopants that have work function values greater than about 5.0 eV. Examples of a few metal and metal oxide dopants and their corresponding work function values include Ni (5.35 eV), Ir (5.67 eV), Pt (5.64 eV), $RuO_2$ (rutile ~5.1 eV), $IrO_2$ (rutile ~5.6 eV), NiO (5.2 eV). These dopants may be added individually or may be added in combination. The dopants may be uniformly distributed throughout the first electrode layer or may be distributed with a gradient in their concentration profile. A second class of dopants may be added to the first electrode to lower the resistivity. The dopants may be metals, metal oxides, metal nitrides, metal silicides, metal carbides, or combinations thereof (i.e. metal-silicon-nitride, or metal-silicon-oxygen-nitride, etc). Two examples of metal oxide materials with low resistivity are $IrO_2$ (~50 µΩ cm) and $RuO_2$ (~35 µΩ cm). The goal is to choose dopants that have resistivity values less than about 1000 µΩ cm. These dopants may be added individually or may be added in combination. The dopants may be uniformly distributed throughout the first electrode layer or may be distributed with a gradient in their concentration profile. $RuO_2$ and $IrO_2$ are examples of dopants that may improve the work function and lower the resistivity (i.e. they serve both rolls). The dopants will be added to a concentration that will not negatively impact the ability of the first electrode layer to form the desired crystalline phase to serve as a template for the rutile phase of $TiO_2$ formed in a subsequent step. The maximum doping concentration will vary depending on the dopant material and subsequent anneal conditions. Generally, the doping concentration is chosen such that it does not prevent the first electrode from crystallizing during the subsequent anneal step. As used herein, the first electrode will be considered to be crystallized if it is $\geq 30\%$ crystalline after the anneal as determined by technique such as x-ray diffraction (XRD).

Optionally, first electrode, 702, can be annealed to crystallize the material. In the case of crystalline $MoO_2$, it is advantageous to anneal the first electrode in a reducing atmosphere to prevent the formation of oxygen-rich compounds as discussed earlier.

In one example of the present invention, a first electrode comprising between about 5 nm and about 15 nm of molybdenum oxide is formed on a substrate. The molybdenum oxide electrode material is formed at a process temperature between about 125 C. and about 400 C. using an ALD process technology. One or more dopants are added to the molybdenum oxide which alter the work function and the resistivity. Examples of suitable dopants comprise Ni, Ir, Pt, $RuO_2$, $IrO_2$, NiO or combinations thereof. Advantageously, the dopants comprise $RuO_2$, $IrO_2$, or combinations thereof. Optionally, the substrate with the first electrode is then annealed in a reducing atmosphere comprising between about 1% and about 10% $H_2$ in $N_2$ or other inert gases and advantageously between about 5% and about 10% $H_2$ in $N_2$ or other inert gases between about 400 C. and about 650 C. for between about 1 millisecond and about 60 minutes.

In the next step, dielectric layer, 704, would then be formed on the annealed first electrode layer, 702. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $BaSrTiO_x$ (BST), $PbZrTiO_x$ (PZT), or doped versions of the same. These dielectric materials may be formed as a single layer or may be formed as a hybrid or nanolaminate structure. Typically, dielectric layer, 704, is subjected to a PDA treatment before the formation of the second electrode as discussed previously. A specific dielectric material of interest is $TiO_2$ doped with Al to between about 5 atomic % and about 15 atomic % Al. The rutile phase of $TiO_2$ will form preferentially on the underlying doped $MoO_2$ electrode resulting in a higher k value.

In a specific example, the dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with Al at a concentration between about 5 atomic % and about 15 atomic %. The $TiO_2$ dielectric layer is formed at a process temperature between about 200 C. and 350 C. using an ALD process technology. The substrate with the first electrode and dielectric layer is then annealed in an oxidizing atmosphere comprising between about 0% O$_2$ to about 100% O$_2$ in N$_2$ and advantageously between about 0% O$_2$ to about 20% O$_2$ in N$_2$ at temperatures between about 400 C. to about 600 C. for between about 1 millisecond to about 60 minutes.

Second electrode, 706, is then formed on dielectric layer, 704. The second electrode is typically a metal such as Ru, Pt, TiN, TaN, TiAlN, W, WN, Mo, MoO$_2$, Mo$_2$N, VN, or others. Advantageously, the second electrode is MoO$_2$. The second electrode is typically between about 5 nm and 50 nm in thickness. As discussed previously, the second electrode may also be doped with one or more dopants to alter the work function and/or the resistivity of the second electrode as described previously. Typically, the capacitor stack is then subjected to a post metallization anneal (PMA) treatment. The PMA treatment serves to crystallize the second electrode and to anneal defects and interface states that are formed at the dielectric/second electrode interface during the deposition.

Figure 8:
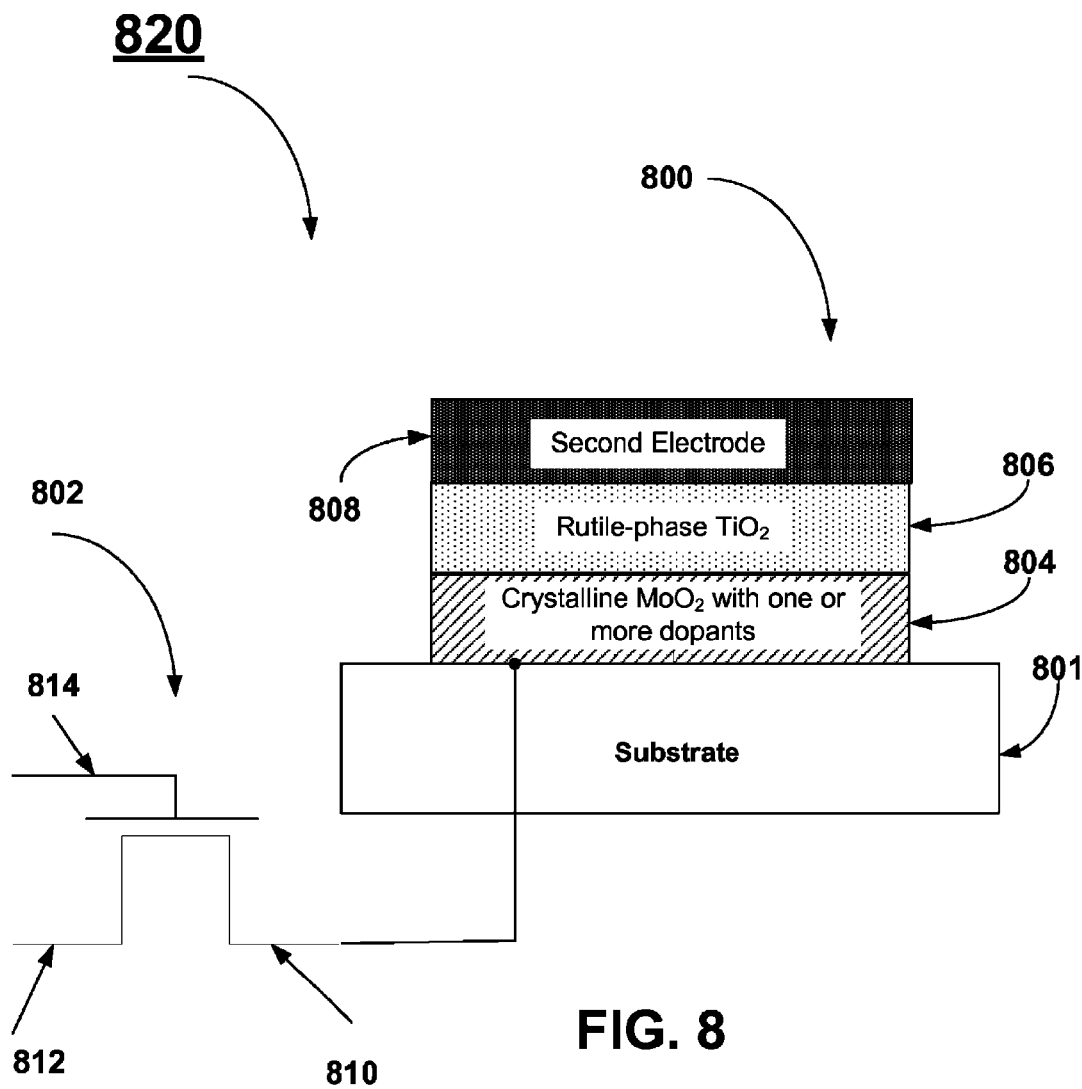
FIG. 8 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 8 is used to illustrate one DRAM cell, 820, manufactured using a doped first electrode structure as discussed previously. The cell, 820, is illustrated schematically to include two principle components, a cell capacitor, 800, and a cell transistor, 802. The cell transistor is usually constituted by a MOS transistor having a gate, 814, source, 810, and drain, 812. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 7, the cell capacitor, 800, comprises a first electrode, 804, formed on substrate, 801. The first electrode, 404, is connected to the source or drain of the cell transistor, 802. For illustrative purposes, the first electrode has been connected to the source, 810, in this example. For the purposes of illustration, first electrode, 804, will be crystalline MoO$_2$ doped with one or more dopants in this example as described previously. Examples of suitable dopants comprise Ni, Ir, Pt, RuO$_2$, IrO$_2$, NiO or combinations thereof. Advantageously, the dopants comprise RuO$_2$, IrO$_2$, or combinations thereof. The dopants may be uniformly distributed throughout the second electrode layer or may be distributed with a gradient in their concentration profile. As discussed previously, first electrode, 804, may be subjected to an anneal in a reducing atmosphere before the formation of the dielectric layer to crystallize the MoO$_2$ and to reduce any MoO$_{2+x}$ compounds that may have formed during the formation of the first electrode. Dielectric layer, 806, is formed on top of the first electrode. For the purposes of illustration, dielectric layer, 806, will be rutile-phase TiO$_2$. As discussed previously, the TiO$_2$ may be doped. Typically, the dielectric layer is then subjected to a PDA treatment. The second electrode layer, 808, is then formed on top of the dielectric layer. For the purposes of illustration, the second electrode layer, 808, will be MoO$_2$ in this example. As discussed previously, the second electrode may also be doped with one or more dopants to alter the work function and/or the resistivity of the second electrode as described previously. The capacitor stack is then subjected to a PMA treatment. This completes the formation of the capacitor stack.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a capacitor stack, the method comprising:
    forming a first electrode layer on a substrate,
        wherein the first electrode layer comprises molybdenum oxide and one or more dopants, the one or more dopants comprising Ni, Ir, Pt, RuO$_2$, IrO$_2$, NiO or combinations thereof;
    forming a dielectric layer on the first electrode layer, the dielectric layer comprising titanium oxide; and
    forming a second electrode layer on the dielectric layer,
        wherein the one or more dopants have a predetermined concentration such that molybdenum oxide is in a crystalline phase prior to forming the dielectric layer on the first electrode layer,
        wherein the first electrode layer serves as a template for a rutile phase of titanium oxide of the dielectric layer while forming the dielectric layer on the first electrode layer.

2. The method of claim 1 wherein the one or more dopants comprise metals, metal oxides, metal nitrides, metal silicides, metal carbides, or combinations thereof.

3. The method of claim 1 wherein the one or more dopants have a work function value of greater than about 5 eV.

4. The method of claim 1 wherein the one or more dopants have a resistivity value of less than about 1000 μΩ cm.

5. The method of claim 1 wherein the one or more dopants comprise RuO$_2$, IrO$_2$, or combinations thereof.

6. The method of claim 1, wherein the second electrode comprises one or more dopants, and wherein the one or more dopants in the first electrode layer are the same as the one or more dopants in the second electrode layer.

7. The method of claim 1, wherein the second electrode comprises one or more dopants, and wherein the one or more dopants in the first electrode layer are different from the one or more dopants in the second electrode layer.

8. The method of claim 1 further comprising annealing the first electrode layer wherein the first electrode layer exhibits ≧30% crystallinity after the anneal.

9. The method of claim 8 wherein the annealing of the first electrode occurs in a reducing atmosphere.

10. The method of claim 9 wherein the reducing atmosphere comprises between about 1% and about 10% H$_2$ in N$_2$.

11. The method of claim 8 wherein the annealing occurs in a temperature range between about 400 C. and about 650 C.

12. The method of claim 8 wherein the annealing occurs in between about 1 millisecond and about 60 minutes.

13. The method of claim 1 wherein the dielectric layer contains a dopant.

14. The method of claim 13 wherein the dopant comprises Al at a concentration between about 5 atomic % and about 15 atomic %.

15. The method of claim 1 further comprising forming a buffer layer between the substrate and the first electrode layer.

16. The method of claim 15 wherein the buffer layer is a conductive metal nitride.

17. The method of claim 15 wherein the buffer layer is molybdenum nitride.

* * * * *